(12) United States Patent
Kunieda et al.

(10) Patent No.: US 11,974,398 B2
(45) Date of Patent: Apr. 30, 2024

(54) ELECTRONIC DEVICE

(71) Applicant: DENSO CORPORATION, Kariya (JP)

(72) Inventors: Hiroyoshi Kunieda, Kariya (JP);
Hiroki Hayashi, Kariya (JP)

(73) Assignee: DENSO CORPORATION, Kariya (JP)

(*) Notice: Subject to any disclaimer, the term of this patent is extended or adjusted under 35 U.S.C. 154(b) by 413 days.

(21) Appl. No.: 17/481,783

(22) Filed: Sep. 22, 2021

(65) Prior Publication Data
US 2022/0007510 A1    Jan. 6, 2022

Related U.S. Application Data

(63) Continuation of application No. PCT/JP2020/010549, filed on Mar. 11, 2020.

(30) Foreign Application Priority Data

Mar. 28, 2019 (JP) .................. 2019-063315

(51) Int. Cl.
*H05K 1/18* (2006.01)

(52) U.S. Cl.
CPC ... *H05K 1/181* (2013.01); *H05K 2201/10734* (2013.01)

(58) Field of Classification Search
CPC .............. H05K 1/181; H05K 2201/10734
USPC ............................................. 257/686
See application file for complete search history.

(56) References Cited

U.S. PATENT DOCUMENTS

| 6,404,062 B1* | 6/2002 | Taniguchi | H01L 25/0655 438/109 |
| 6,940,176 B2* | 9/2005 | Chen | H01L 24/06 257/E23.07 |
| 2004/0112633 A1 | 6/2004 | Endo et al. | |
| 2004/0173891 A1 | 9/2004 | Imai et al. | |
| 2004/0173903 A1* | 9/2004 | Yang | H01L 23/36 257/E23.101 |
| 2014/0103544 A1 | 4/2014 | Yokoyama et al. | |
| 2020/0058611 A1* | 2/2020 | Lin | H01L 24/17 |

FOREIGN PATENT DOCUMENTS

| JP | H03105954 A | 5/1991 |
| JP | 2000323602 A | 11/2000 |
| JP | 2004103665 A | 4/2004 |
| JP | 2004356620 A | 12/2004 |
| JP | 2006313800 A | 11/2006 |
| JP | 5961625 B2 | 8/2016 |
| JP | 2016162815 A | 9/2016 |
| KR | 100839075 B1 | 6/2008 |

* cited by examiner

*Primary Examiner* — Xia L Cross
(74) *Attorney, Agent, or Firm* — Harness, Dickey & Pierce, P.L.C.

(57) ABSTRACT

An electronic device includes an upper package including an upper chip, a lower package including a lower chip, a printed circuit board above which the upper package and the lower package are laminated, solder balls connecting the upper package and the lower package, solder balls connecting the lower package and the printed circuit board. The lower package has a thermal expansion coefficient set between a thermal expansion coefficient of the upper package and a thermal expansion coefficient of the printed circuit board.

3 Claims, 9 Drawing Sheets

ELECTRONIC DEVICE

CROSS REFERENCE TO RELATED APPLICATIONS

The present application is a continuation application of International Patent Application No. PCT/JP2020/010549 filed on Mar. 11, 2020, which designated the U.S. and claims the benefit of priority from Japanese Patent Application No. 2019-063315 filed on Mar. 28, 2019. The entire disclosures of all of the above applications are incorporated herein by reference.

TECHNICAL FIELD

The present disclosure relates to an electronic device.

BACKGROUND

There has been known an electronic device in which a package on package (PoP) formed by laminating two IC packages is mounted on a printed circuit board.

SUMMARY

The present disclosure provides an electronic device including a upper package including an upper chip, a lower package including a lower chip, a printed circuit board above which the upper package and the lower package are laminated, solder balls connecting the upper package and the lower package, and solder balls connecting the lower package and the printed circuit board. The lower package has a thermal expansion coefficient set between a thermal expansion coefficient of the upper package and a thermal expansion coefficient of the printed circuit board.

BRIEF DESCRIPTION OF DRAWINGS

Objects, features and advantages of the present disclosure will become apparent from the following detailed description made with reference to the accompanying drawings. In the drawings.

DETAILED DESCRIPTION

During a thermal cycle test of an electronic device in which an upper package and a lower package are mounted on a printed circuit board, a solder strain may occur at a solder connection portion connecting the upper package and the lower package and a solder connection portion connecting the lower package and the printed circuit board, and the solder stain may cause a solder crack and a connection failure.

An electronic device according to an aspect of the present disclosure includes an upper package including an upper chip, a lower package including a lower chip, a printed circuit board above which the upper package and the lower package are laminated, solder balls connecting the upper package and the lower package, and solder balls connecting the lower package and the printed circuit board. The lower package has a thermal expansion coefficient set between a thermal expansion coefficient of the upper package and a thermal expansion coefficient of the printed circuit board.

According to the electronic device described above, a solder strain generated in solder connection portions is dispersed by averaging the thermal expansion coefficients. As a result, a solder connection life and a reliability of the electronic device can be improved.

Hereinafter, electronic devices according to multiple embodiments of the present disclosure will be described with reference to the drawings. In the following description, the same elements as those mentioned above will be given the same reference numerals or the same names, and the description thereof will be omitted. In the drawings, a direction toward an upper package 10 is defines as an upward direction, and a direction toward a printed circuit board 16 is defined as a downward direction.

First Embodiment

Figure 1:
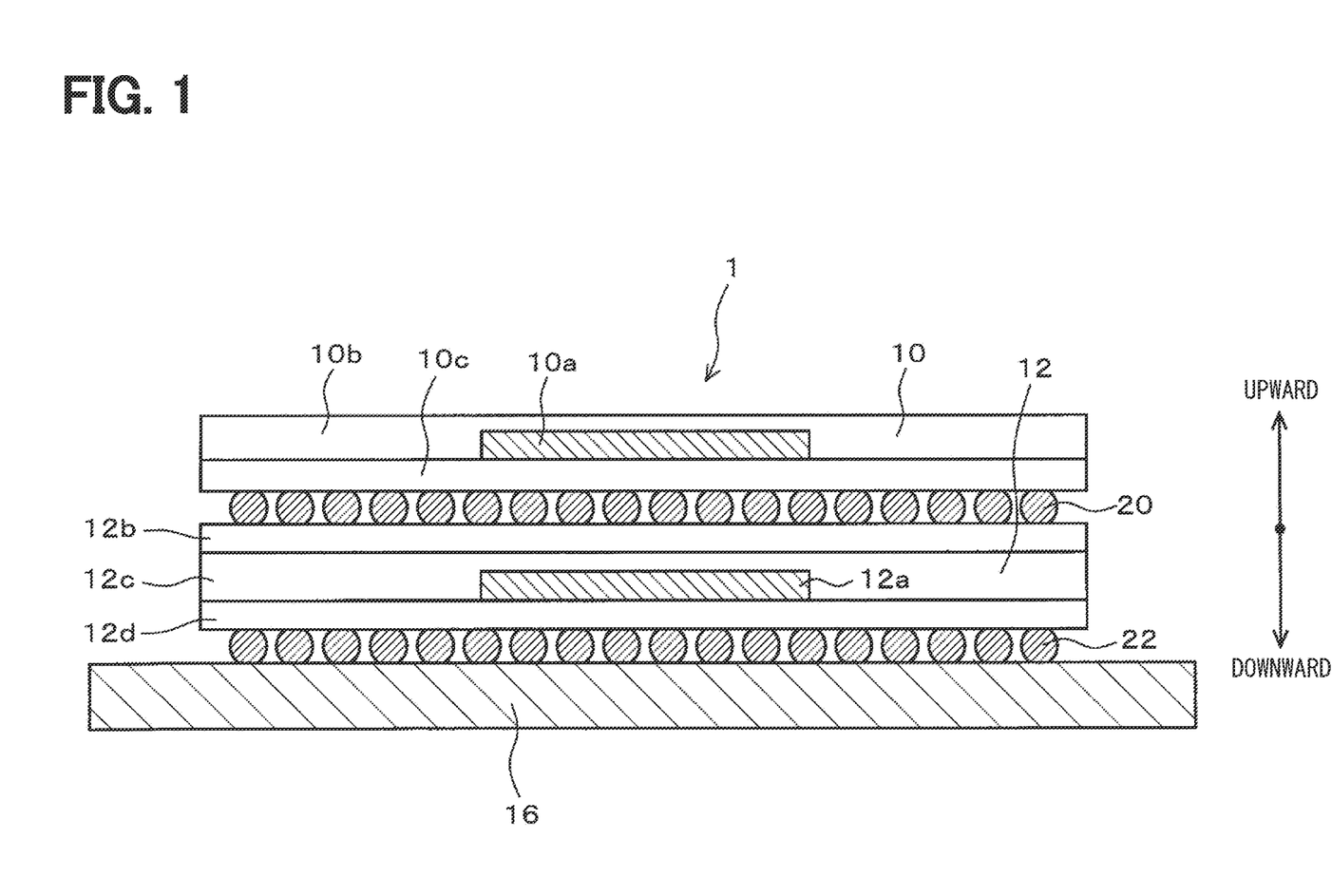
FIG. 1 is a vertical cross-sectional view showing a schematic configuration of an electronic device according to a first embodiment.

As shown in FIG. 1, an electronic device 1 according to a first embodiment is a so-called PoP in which two IC packages, an upper package 10 and a lower package 12, are laminated. The electronic device 1 includes a printed circuit board 16, the upper package 10, and the lower package 12. The upper package 10 and the lower package 12 are laminated in a vertical direction above the printed circuit board 16. Each of the electronic device 1, the upper package 10, and the lower package 12 has a substantially rectangular flat plate shape.

Between the upper package 10 and the lower package 12, upper solder balls 20 are arranged. The upper solder balls 20 connect the upper package 10 and the lower package 12. Between the lower package 12 and the printed circuit board 16, lower solder balls 22 are arranged. The lower solder balls 22 connect the lower package 12 and the printed circuit board 16.

A solder strain generated in the solder balls is proportional to a difference between linear expansion coefficients in the package plane direction of connected members connected by the solder balls. In this case, the magnitude of the solder strain generated in the upper solder balls 20 is proportional to the difference between the linear expansion coefficient $\alpha_{top}$ of the upper package 10 and the linear expansion coefficient $\alpha_{Bottom}$ of the lower package 12. The magnitude of the solder strain generated in the lower solder balls 22 is proportional to the difference between the linear expansion coefficient $\alpha_{Bottom}$ of the lower package 12 and the linear expansion coefficient $\alpha_{PCB}$ of the printed circuit board 16.

The upper package 10 includes an upper chip 10a, an upper layer 10b, and a lower layer 10c. The upper chip 10a is arranged on the lower layer 10c. The upper layer 10b covers an upper surface and a side surface of the upper chip 10a. The upper chip 10a is an integrated circuit in which multiple transistors, wiring, and the like are mounted on a semiconductor substrate (not shown), that is, an IC chip. The upper layer 10b is, for example, a mold resin. The lower layer 10c is, for example, a printed circuit board. The upper chip 10a has a substantially rectangular flat plate shape.

The lower package 12 includes a lower chip 12a, an upper layer 12b, an intermediate layer 12c, and a lower layer 12d. The lower chip 12a is arranged on the lower layer 12d. The intermediate layer 12c covers an upper surface and a side surface of the lower chip 12a. The upper layer 12b is arranged on the intermediate layer 12c. The lower chip 12a has a substantially rectangular flat plate shape. Each of the upper package 10, the lower package 12, the upper chip 10a, and the lower chip 12a provided in the electronic device 1 also has a substantially rectangular shape in a plane.

The lower chip 10a is an integrated circuit in which multiple transistors, wiring, and the like are mounted on a semiconductor substrate (not shown), that is, an IC chip. The upper layer 12b and the lower layer 12d are, for example, printed circuit boards. The intermediate layer 12c is, for example, a mold resin.

Each of the printed circuit board 16, and the upper layer 12b and the lower layer 12d, which are the printed circuit boards included in the lower package 12, is formed by arranging wirings (not shown) on a base material formed of an electrically insulating material such as resin to form a circuit. The electronic device 1 has a substantially rectangular shape in a plane. The mold resin is made of a material obtained by adding a filler such as silica to, for example, an epoxy resin which is a thermosetting resin.

In the electronic device 1 according to the first embodiment, the thermal expansion coefficient of the printed circuit board 16 is set to be larger than the thermal expansion coefficients of the upper package 10 and the lower package 12. In addition, the thermal expansion coefficient of the lower package 12 is set between the thermal expansion coefficient of the upper package 10 and the thermal expansion coefficient of the printed circuit board 16. Here, assuming that the thermal expansion coefficient of the upper package 10 is $\alpha_{Top}$, the thermal expansion coefficient of the lower package 12 is $\alpha_{Bottom}$, and the thermal expansion coefficient of the printed circuit board 16 is $\alpha_{PCB}$, the thermal expansion coefficients are set to be greater in the order of $\alpha_{Top}$, $\alpha_{Bottom}$, and $\alpha_{PCB}$ in ascending order.

The thermal expansion coefficients of the upper package 10, the lower package 12, and the printed circuit board 16 are calculated by the following mathematical expression (1).

$$\alpha = (\alpha_f E_f V_f + \alpha_m E_m V_m + \ldots)/(E_f V_f + E_m V_m + \ldots) \ldots \quad (1)$$

The mathematical expression (1) is a so-called Turner equation. In the mathematical expression (1), $\alpha$ is the linear expansion coefficient, E is the elastic modulus, V is the volume, and $V_f + V_m + \ldots = 1$.

In the electronic device 1 according to the first embodiment, the thermal expansion coefficients are set so as to satisfy the following mathematical expression (2).

$$\alpha_{Top} < \alpha_{Bottom} < \alpha_{PCB} \ldots \quad (2)$$

Further, preferably, the thermal expansion coefficient of the lower package 12 is set to be substantially the center between the thermal expansion coefficient of the upper package 10 and the thermal expansion coefficient of the printed circuit board 16. In this case, the following mathematical expression (3) is satisfied.

$$\alpha_{Bottom} - \alpha_{Top} = \alpha_{PCB} - \alpha_{Bottom} \ldots \quad (3).$$

Further, in this case, it is preferable that the absolute value of a difference between a difference between the thermal expansion coefficient of the upper package 10 and the thermal expansion coefficient of the lower package 12 and a difference between the thermal expansion coefficient of the lower package 12 and the thermal expansion coefficient of the printed circuit board 16 is 3.5 (ppm/° C.) or less. That is, when the diameter of each of the upper solder balls 20 is $\phi_{Top}$ and the diameter of each of the lower solder balls 22 is $\phi_{Bottom}$, the thermal expansion coefficients of the upper package 10, the lower package 12, and the printed circuit board 16 are set so as to satisfy the following mathematical expression (4).

$$|(\alpha_{Bottom} - \alpha_{Top}) - (\alpha_{PCB} - \alpha_{Bottom})| \leq 3.5 (\text{ppm}/° \text{C.}) \ldots \quad (4)$$

Further, in the electronic device 1 according to the first embodiment, the diameter of each of the upper solder balls 20 arranged between the upper package 10 and the lower package 12 is set to be substantially the same as the diameter of each of the lower solder balls 22 arranged between the lower package 12 and the printed circuit board 16. Since the diameters of the upper solder balls 20 and the lower solder balls 22 are substantially the same, a contact area of the upper solder balls 20 with the upper package 10 and the lower package 12 and a contact area of the lower solder balls 22 with the lower package 12 and the printed circuit board 16 are substantially the same, and fracture resistances of the upper solder balls 20 and the lower solder balls 22 are substantially the same. Therefore, the crack resistances of the upper solder balls 20 and the lower solder balls 22 against solder strain are substantially the same.

In this case, the thermal expansion coefficients of the upper package 10, the lower package 12, and the printed circuit board 16 are set so as to satisfy the following mathematical expression (5).

$$\text{When } \phi_{Top} = \phi_{Bottom}, (\alpha_{Bottom} - \alpha_{Top}) \approx (\alpha_{PCB} - \alpha_{Bottom}) \ldots \quad (5)$$

The thermal expansion coefficients of the upper package 10, the lower package 12, and the printed circuit board 16 can be controlled as follows. The thermal expansion coefficients increase with increase of thicknesses of the upper package 10, the lower package 12, and the printed circuit board 16, and the thermal expansion coefficients decrease with decrease of the thicknesses of the upper package 10, the lower package 12, and the printed circuit board 16. Further, the thermal expansion coefficients can be increased by increasing the thicknesses of the upper layer 10b and the intermediate layer 12c made of the mold resin.

Further, the thermal expansion coefficients can be increased by increasing thicknesses of solder resists, prepreg layers and core layers (not shown) or thicknesses or residual ratios of copper films used as copper wires (not shown) which are included in the lower layer 10c of the upper package 10, the upper layer 12a and the lower layer 12d of the lower package 12, which are made of printed circuit boards. On the other hand, the thermal expansion coefficients can be decreased by decreasing these thicknesses or residual ratios.

In the above embodiment, since the above mathematical expressions (2) to (5) can be satisfied by controlling the thermal expansion coefficient of the lower package 12, it is sufficient to control the thermal expansion coefficient of the lower package 12. However, it does not limit the control of the thermal expansion coefficients of the upper package 10 and the printed circuit board 16.

According to the electronic device 1 according to the first embodiment described above, the following effects are obtained. Since the thermal expansion coefficient of the printed circuit board 16 is large, the rate of expansion due to thermal fluctuation is large. In contrast, since the thermal expansion coefficient of the upper package 10 is small, the rate of expansion due to thermal fluctuation is smaller than the printed circuit board 16. Thus, when thermal fluctuation occurs, distortion occurs between the printed circuit board 16 in which the dimensional fluctuation due to expansion is large and the upper package 10 in which the dimensional fluctuation due to expansion is small. Therefore, if the thermal expansion coefficient of the lower package 12 is close to either the package 10 or the printed circuit board 16, the solder strain may concentrate on either the upper solder balls 20 or the lower solder balls 22, and the solder strain may become large, so that solder cracks may occur.

For example, when the thermal expansion coefficient of the upper package 10 and the thermal expansion coefficient of the lower package 12 are close to each other, the solder strain concentrates on the lower solder balls 22 arranged between the lower package 12 and the printed circuit board 16, so that solder cracks are likely to occur at the lower solder balls 22. On the other hand, when the thermal expansion coefficient of the lower package 12 and the thermal expansion coefficient of the printed circuit board 16 are close to each other, the solder strain concentrates on the upper solder balls 20 arranged between the upper package 10 and the lower package 12, so that solder cracks are likely to occur at the lower solder balls 22.

According to the first embodiment, the lower package 12 having the above-described configuration is interposed between the upper package 10 and the printed circuit board 16. Accordingly, the strain between the upper package 10 and the printed circuit board 16 due to the thermal fluctuation can be averaged by the lower package 12. Since the concentration of solder strain on either the upper solder balls 20 or the lower solder balls 22 can be suppressed, the concentration of solder strain can be reduced and the occurrence of solder cracks can be suppressed. In this way, the solder connection life can be improved by averaging the solder strain generated in the solder connection portion by dispersing the solder strain. As a result, an electronic device having improved reliability can be provided.

Second and Third Embodiments

Next, electronic devices 1 according to a second embodiment and a third embodiment will be described with reference to FIG. 2 and FIG. 3. In the second embodiment and the third embodiment, the electronic device 1 has a configuration similar to the electronic device 1 according to the first embodiment, but differs in the following points.

Figure 2:
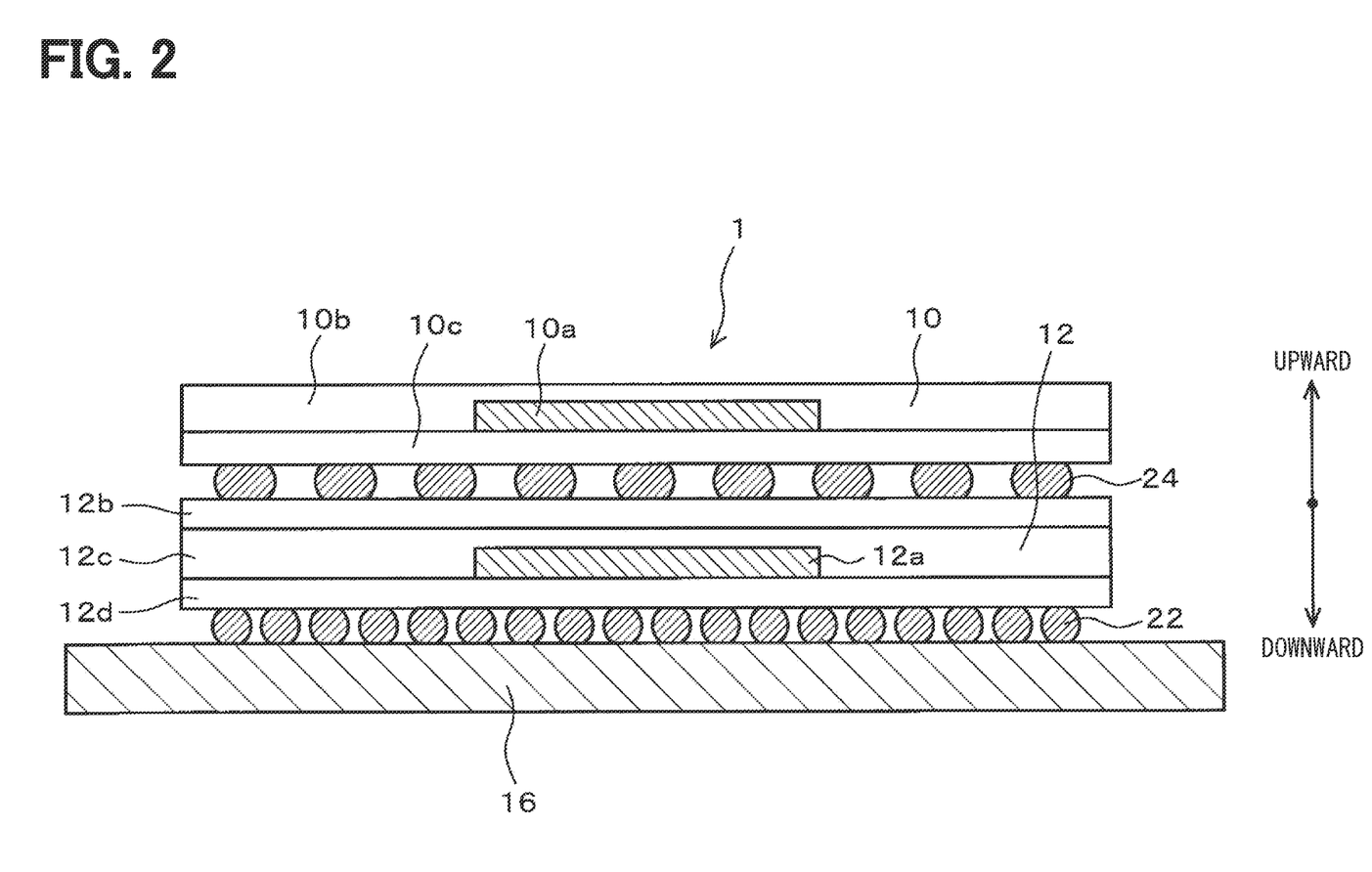
FIG. 2 is a vertical cross-sectional view showing a schematic configuration of an electronic device according to a second embodiment.

As shown in FIG. 2, in the electronic device 1 according to the second embodiment, upper solder balls 24 are arranged between the upper package 10 and the lower package 12 and connect the upper package 10 and the lower package 12. The diameter $\phi_{Top}$ of the upper solder balls 24 is set to be larger than the diameter $\phi_{Bottom}$ of lower solder balls 22 arranged between the lower package 12 and the printed circuit board 16.

When the diameter of the solder balls increase, the contact area with the upper layer or the lower layer increase. Further, when the size of the solder balls increase, the fracture resistance of the solder balls increase. Therefore, the crack resistance of the solder connection portion is improved when the diameter of the solder balls increases.

When the difference in the thermal expansion coefficient between the upper package 10 and the lower package 12 is large and the solder strain is large, the crack resistance can be ensured by increasing the size of the upper solder balls 24. That is, when the upper solder balls 24 having a large size are arranged between the upper package 10 and the lower package 12, the crack resistance can be improved even when the solder strain between the upper package 10 and the lower package 12 is large.

In the second embodiment, since the diameter of the upper solder balls 24 is large, the crack resistance of the solder connection portion by the upper solder balls 24 is improved even if the difference in the thermal expansion coefficient between the upper package 10 and the lower package 12 is large. As a result, the occurrence of cracks can be suppressed.

Here, assuming that the thermal expansion coefficient of the upper package 10 is $\alpha_{Top}$, the thermal expansion coefficient of the lower package 12 is $\alpha_{Bottom}$, and the thermal expansion coefficient of the printed circuit board 16 is $\alpha_{PCB}$, in the electronic device 1 according to the second embodiment, the thermal expansion coefficients are set so as to satisfy the following mathematical expression (6).

$$\text{When } \phi_{Top} > \phi_{Bottom}, (\alpha_{Bottom} - \alpha_{Top}) > (\alpha_{PCB} - \alpha_{Bottom}) \quad (6)$$

Figure 3:
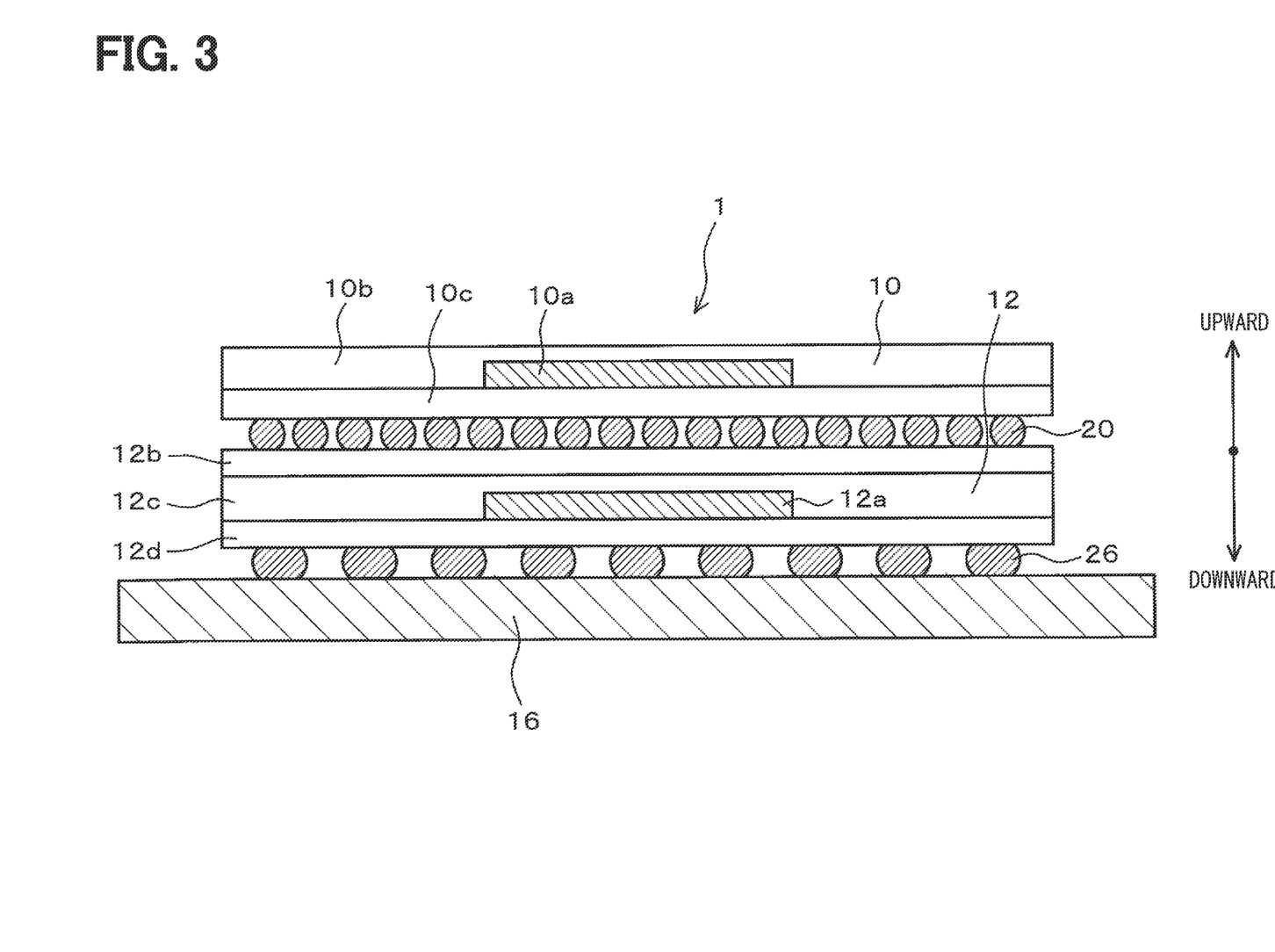
FIG. 3 is a vertical cross-sectional view showing a schematic configuration of an electronic device according to a third embodiment.

On the other hand, as shown in FIG. 3, in the electronic device 1 according to the third embodiment, the arrangement of the solder balls having a large diameter is upside down with respect to the electronic device 1 according to the second embodiment shown in FIG. 2. As shown in FIG. 3, the diameter $\phi_{Top}$ of the upper solder balls 20 is smaller than the diameter $\phi_{Bottom}$ of the lower solder balls 26 arranged between the lower package 12 and the printed circuit board 16. In this case, since the diameter of the lower solder balls 26 is larger than the diameter of the upper solder balls 20, occurrence of cracks in the lower solder balls 26 can be suppressed even if the difference in the thermal expansion coefficient between the lower package 12 and the printed circuit board 16 is large.

When the difference in the thermal expansion coefficient between the lower package 12 and the printed circuit board 16 is large and the solder strain is large, the crack resistance can be ensured by increasing the size of the lower solder balls 26. That is, when the lower solder balls 26 having a large size are arranged between the lower package 12 and the printed circuit board 16, the crack resistance can be improved even when the solder strain between the lower package 12 and the printed circuit board 16 is large.

At this time, the thermal expansion coefficients are set so as to satisfy the following mathematical expression (7).

$$\text{When } \phi_{Top} < \phi_{Bottom}, (\alpha_{Bottom} - \alpha_{Top}) < (\alpha_{PCB} - \alpha_{Bottom}) \quad (7)$$

That is, when the diameter $\phi_{Top}$ of the solder balls 20 connecting the upper package 10 and the lower package 12 is smaller than the diameter $\phi_{Bottom}$ of the solder balls 26 connecting the lower package 12 and the printed circuit board 16, the difference between the thermal expansion coefficient $\alpha_{Top}$ of the upper package 10 and the thermal expansion coefficient $\alpha_{Bottom}$ of the lower package 12 is smaller than the difference between the thermal expansion coefficient aBottom of the lower package 12 and the thermal expansion coefficient $\alpha_{PCB}$ of the printed circuit board 16.

In the second and third embodiments described above, when the upper solder balls 24 and the lower solder balls 26 are elliptical, the major axis of the ellipse is regarded as the diameter.

The solder crack resistance of the solder balls is proportional to the diameter of the solder balls. Therefore, the ratio of the difference in the thermal expansion coefficient between the lower package 12 and the printed circuit board 16 to the difference in the thermal expansion coefficient between the upper package 10 and the lower package 12 can be set to be substantially equal to the ratio of the diameter $\phi_{Bottom}$ of the lower solder balls 22 to the diameter $\phi_{Top}$ of the upper solder balls 24.

At this time, the thermal expansion coefficients and the diameter of the upper solder balls are set so as to satisfy the following mathematical expression (8).

$$\phi_{Top}: \phi_{bottom} = (\alpha_{Bottom} - \alpha_{Top}):(\alpha_{PCB} - \alpha_{Bottom}) \quad \ldots (8)$$

That is, the ratio of the diameter $\phi_{Bottom}$ of the solder balls connecting the lower package and the printed circuit board to the diameter $\phi_{Top}$ of the solder balls connecting the upper package and the lower package is equal to the ratio of the difference between the thermal expansion coefficient $\alpha_{Bottom}$ of the lower package and the thermal expansion coefficient $\alpha_{PCB}$ of the printed circuit board to the difference between the thermal expansion coefficient $\alpha_{TOP}$ of the upper package and the thermal expansion coefficient $\alpha_{Bottom}$ of the lower package.

As a result, depending on the difference in the thermal expansion coefficient between the upper package 10, the lower package 12, and the printed circuit board 16, that is, the magnitude of the solder strain, the upper solder balls 24 or the lower solder balls 26 can be arranged so as to ensure the crack resistance at the solder connection portion. That is, the size of the upper solder balls 24 or the lower solder balls 26 is increased in the place where the difference in the thermal expansion coefficient between the upper package 10, the lower package 12, and the printed circuit board 16 is large, that is, the place where the solder strain is large, so that the crack resistance at the solder connection portion can be improved. Therefore, the crack resistance of the electronic device 1 can be efficiently improved.

According to the electronic devices 1 according to the second embodiment and the third embodiment, effects similar to the effects of the electronic device 1 according to the first embodiment can be obtained.

Fourth Embodiment

Figure 4:
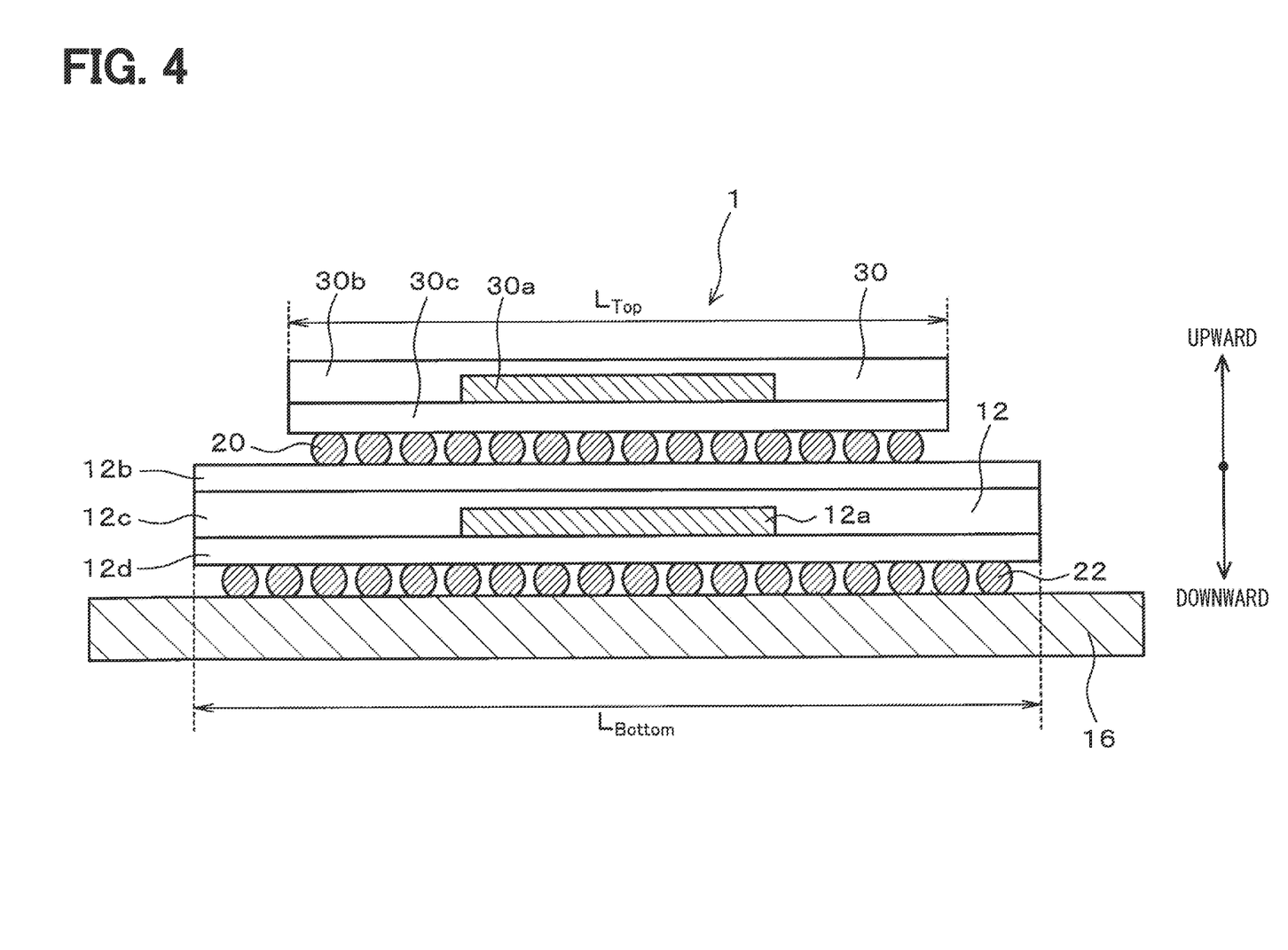
FIG. 4 is a vertical cross-sectional view showing a schematic configuration of an electronic device according to a fourth embodiment.

Next, an electronic device 1 according to a fourth embodiment will be described with reference to FIG. 4. In the fourth embodiment, a lateral dimension $L_{Top}$ of an upper package 30 arranged on the upper side of the electronic device 1 is set to be smaller than a lateral dimension $L_{Bottom}$ of the lower package 12 arranged on the lower side. Here, the dimensional fluctuation due to the thermal fluctuation of the package increases with increase in the lateral dimension of each package. Therefore, the solder strain in a package having a large lateral dimension is larger than that in a package having a small lateral dimension.

In the electronic device 1 according to the fourth embodiment, the lateral dimension $L_{Bottom}$ of the lower package 12 arranged on the lower side is larger than the lateral dimension $L_{Top}$ of the upper package 30. Therefore, the solder strain in the lower solder balls 22 on the lower package 12 is larger than the solder strain in the upper solder balls 20 on the upper package 30.

Therefore, in the fourth embodiment, when the lateral dimension $L_{Top}$ of the upper package 30 is smaller than the lateral dimension $L_{Bottom}$ of the lower package 12, the difference between the thermal expansion coefficient of the upper package 30 and the thermal expansion coefficient of the lower package 12 is set to be larger than the difference between the thermal expansion coefficient of the lower package 12 and the thermal expansion coefficient of the printed circuit board 16.

That is, the thermal expansion coefficients are set so as to satisfy the following mathematical expression (9).

$$\text{When } L_{Top} < L_{Bottom}, (\alpha_{Bottom} - \alpha_{Top}) > (\alpha_{PCB} - \alpha_{Bottom}) \ . \quad (9)$$

That is, when the lateral dimension $L_{Bottom}$ of the lower package 12 is larger than the lateral dimension $L_{Top}$ of the upper package 30, the difference between the thermal expansion coefficient $\alpha_{Top}$ of the upper package 30 and the thermal expansion coefficient $\alpha_{Bottom}$ of the lower package 12 is larger than the difference between the thermal expansion coefficient $\alpha_{Bottom}$ of the lower package and the thermal expansion coefficient $\alpha_{PCB}$ of the printed circuit board 16.

The solder strain is proportional to the lateral dimension of the package. Therefore, the ratio of the lateral dimension $L_{Top}$ of the upper package 30 to the lateral dimension $L_{Bottom}$ of the lower package 12 is set to be substantially equal to the ratio of the difference between the thermal expansion coefficient of the upper package 30 and the thermal expansion coefficient of the lower package 12, so that the solder strain can be averaged.

That is, the thermal expansion coefficients are set so as to satisfy the following mathematical expression (10).

$$L_{Top}: L_{Bottom} = (\alpha_{PCB} - \alpha_{Bottom}):(\alpha_{Bottom} - \alpha_{Top}) \ldots \quad (10)$$

That is, the ratio of the lateral dimension $L_{Bottom}$ of the lower package 12 to the lateral dimension $L_{Top}$ of the upper package 30 is equal to ratio of the difference between the thermal expansion coefficient $\alpha_{Bottom}$ of the lower package 12 and the thermal expansion coefficient $\alpha_{PCB}$ of the printed circuit board 16 to the difference between the thermal expansion coefficient $\alpha_{Top}$ of the upper package 30 and the thermal expansion coefficient $\alpha_{Bottom}$ of the lower package 12.

According to the electronic device 1 according to the fourth embodiment, effects similar to the effects of the electronic device 1 according to the first embodiment can be obtained.

Fifth Embodiment

Figure 5:
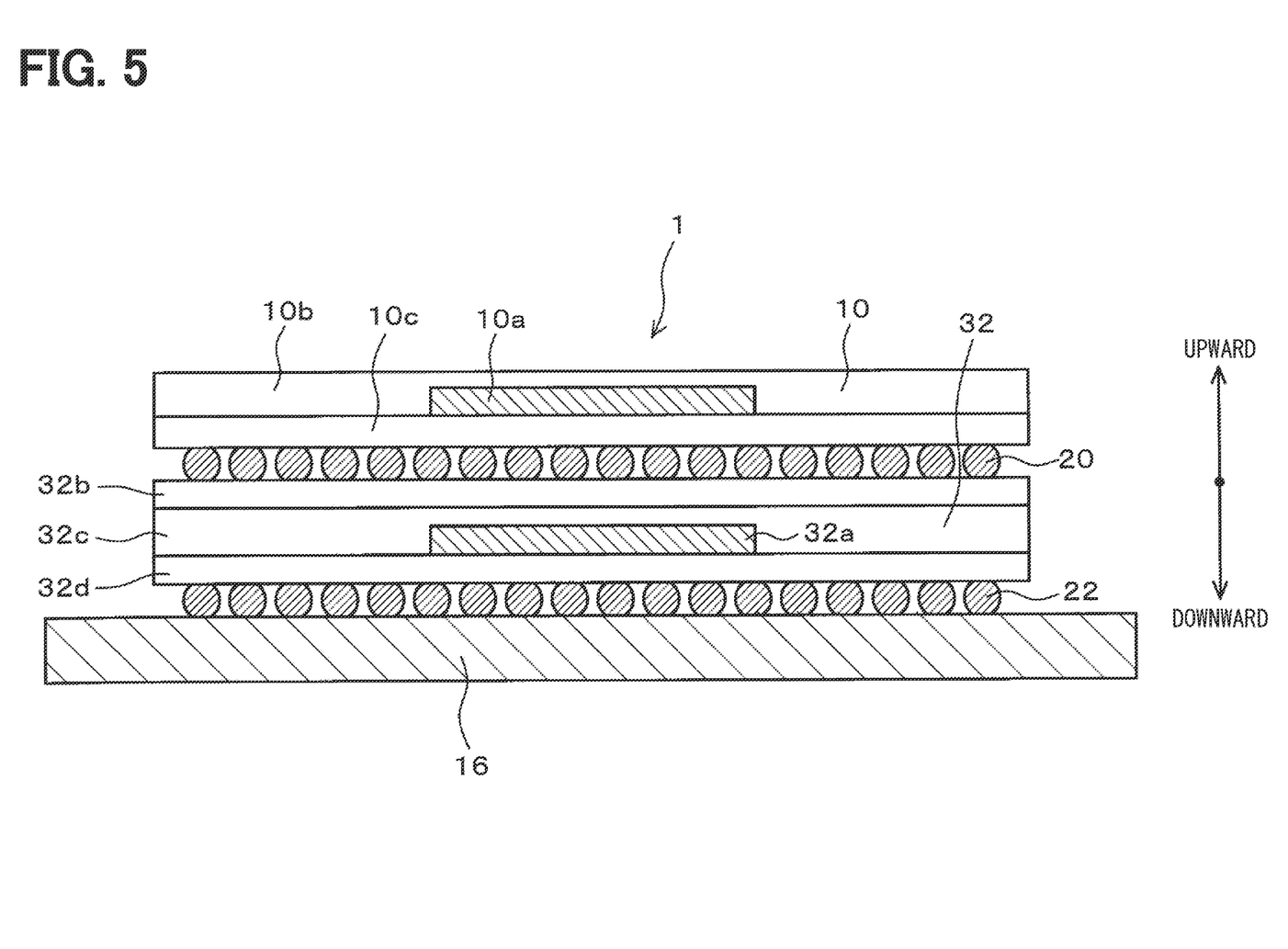
FIG. 5 is a vertical cross-sectional view showing a schematic configuration of an electronic device according to a fifth embodiment.

Next, an electronic device 1 according to a fifth embodiment will be described. As shown in FIG. 5, in the electronic device 1, the lower package 32 has a multilayer structure including a lower chip 32a, an upper layer 32b, an intermediate layer 32c, and a lower layer 32d. Also in the fifth embodiment, it is assumed that the thermal expansion coefficient of the printed circuit board 16 is larger than the thermal expansion coefficient of the upper package 10 in a manner similar to the first to fourth embodiments.

In the fifth embodiment, a thermal expansion coefficient of the lower layer 32d is set to be larger than a thermal expansion coefficient of the upper layer 32b. In other words, the thermal expansion coefficient of the upper layer 32b is set to be smaller than the thermal expansion coefficient of the lower layer 32d. Since the upper layer 32b having a small thermal expansion coefficient is connected to the upper package 10 having a small thermal expansion coefficient via the upper solder balls 20, and the lower layer 32d having a large thermal expansion coefficient is connected to the printed circuit board 16 having a large thermal expansion coefficient, the difference in the thermal expansion coefficient is reduced in connection regions of the upper solder balls 20 and the lower solder balls 22. As a result, the solder strain can be averaged.

At this time, the thermal expansion coefficients are set so as to satisfy the following mathematical expression (11).

$$\text{When } \alpha_{Top} < \alpha_{Bottom} < \alpha_{PCB}, \alpha_{Bottom\ up} < \alpha_{Bottom\ low} \cdots \quad (11)$$

In the mathematical expression (11), $\alpha_{Bottom\ up}$ is the thermal expansion coefficient of the upper layer 32b of the lower package 32, and $\alpha_{Bottom\ low}$ is the thermal expansion coefficient of the lower layer 32d.

According to the electronic device 1 according to the fifth embodiment, effects similar to the effects of the electronic device 1 according to the first embodiment can be obtained.

Sixth Embodiment

Figure 6:
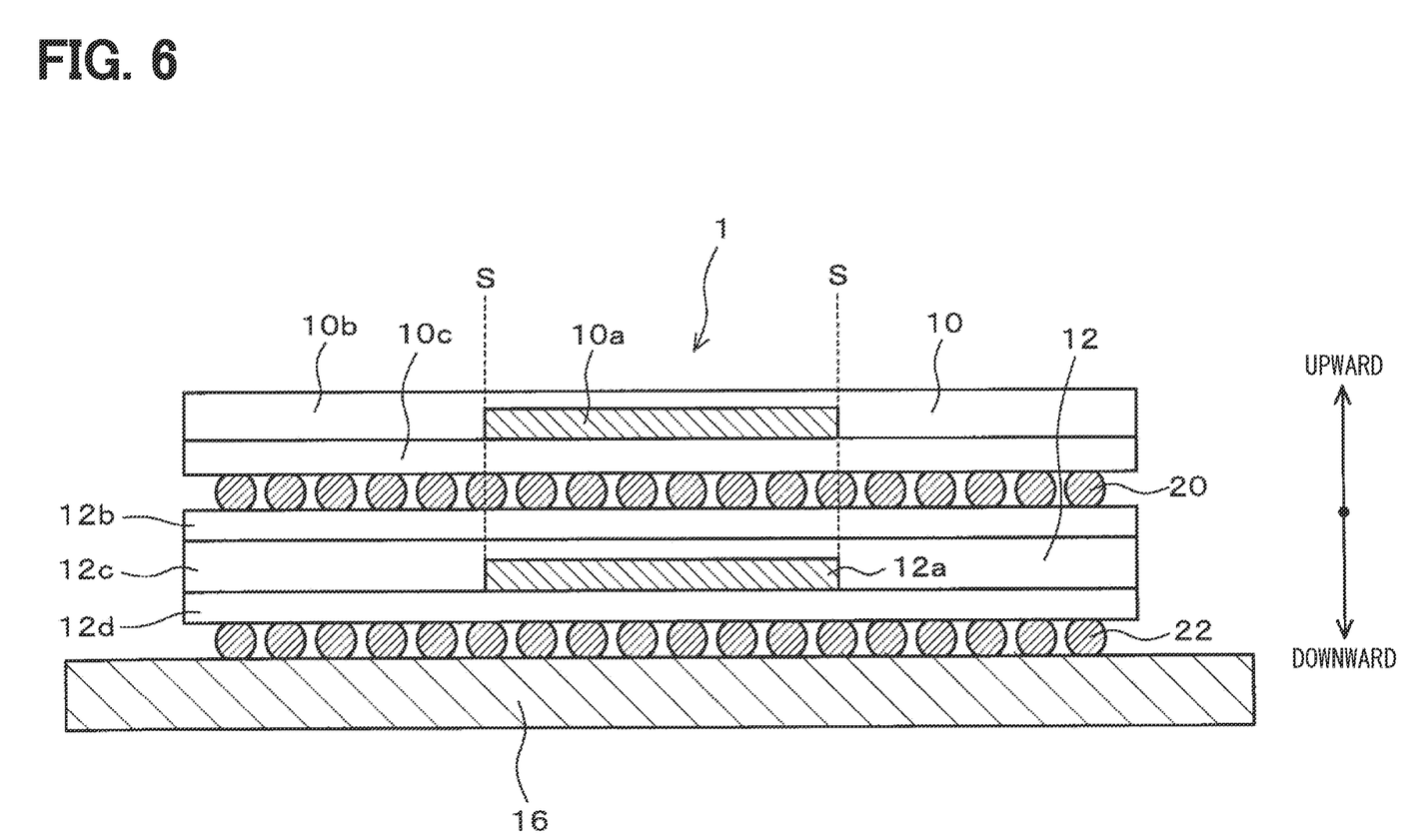
FIG. 6 is a vertical cross-sectional view showing a schematic configuration of an electronic device according to a sixth embodiment.

Next, an electronic device 1 according to a sixth embodiment will be described. As shown in FIG. 6, in the electronic device 1 according to the sixth embodiment, the upper package 10 and the lower package 12 are arranged in such a manner that lengths of the lower chip 10a and the lower chip 12a in a longitudinal direction are equal to each other, and end positions S of the lower chip 10a and the lower chip 12a in the longitudinal direction match each other. As a result, the warped shapes of the upper package 10 and the upper solder ball 20 due to thermal fluctuation can be matched, so that the solder crack resistance of the solder connection portion between the upper package 10 and the lower package 12 can be improved.

Seventh Embodiment

Figure 7:
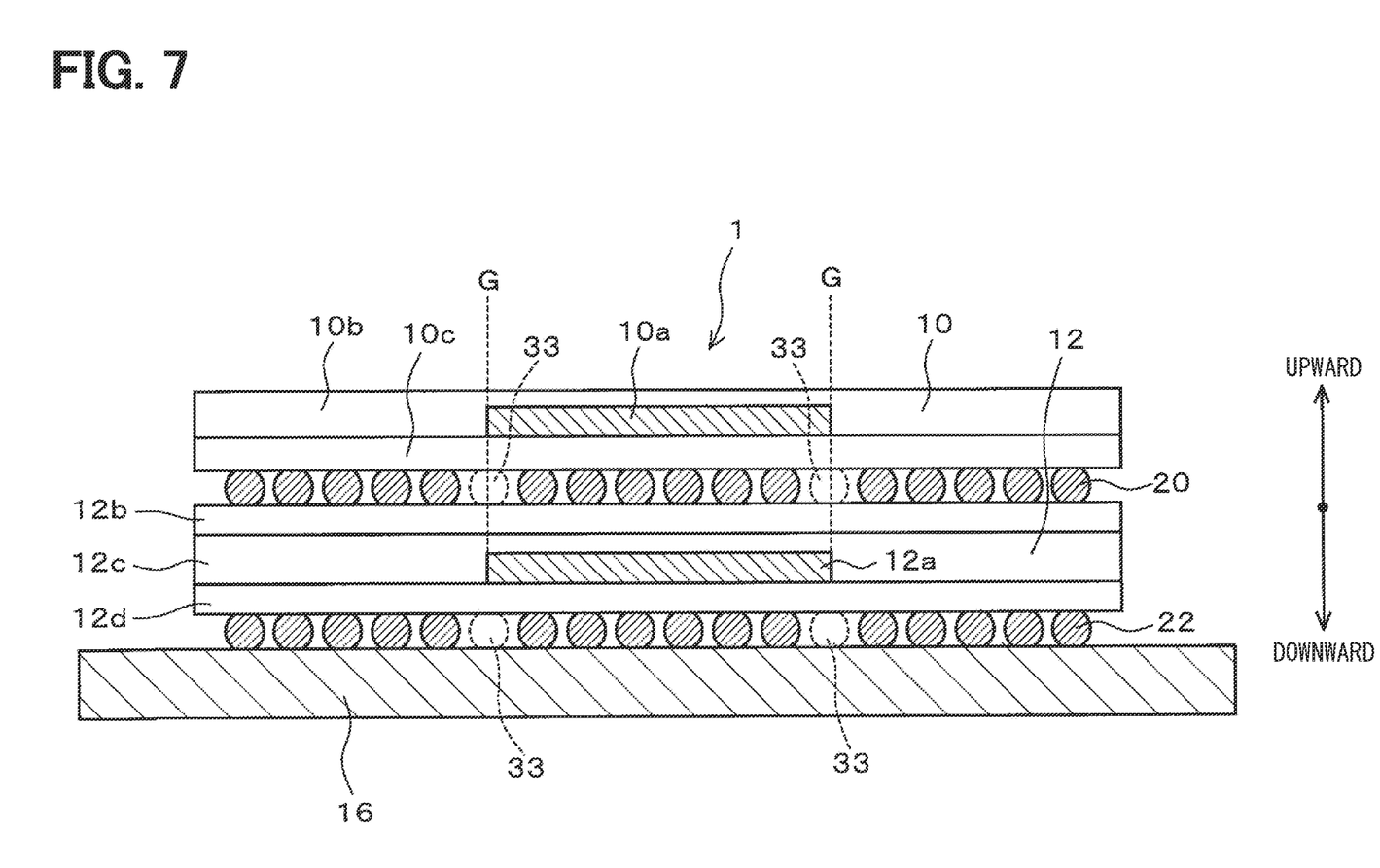
FIG. 7 is a vertical cross-sectional view showing a schematic configuration of an electronic device according to a seventh embodiment.

Next, an electronic device 1 according to a seventh embodiment will be described. As shown in FIG. 7, in the electronic device 1 according to the seventh embodiment, the upper package 10 and the lower package 12 are arranged in such a manner that lengths of the lower chip 10a and the lower chip 12a in a longitudinal direction are equal to each other, and end positions G of the lower chip 10a and the lower chip 12a in the longitudinal direction match each other. Further, solder ball missing portions 33 in which no solder ball is present are provided between the upper package 10 and the lower package 12 and between the lower package 12 and the printed circuit board 16 so as to match the end positions G. Since the solder ball missing portions 33 are provided at the end positions G where the solder strain becomes locally large, solder cracks in the vicinity of the end positions G can be suppressed.

Eighth Embodiment

Figure 8:
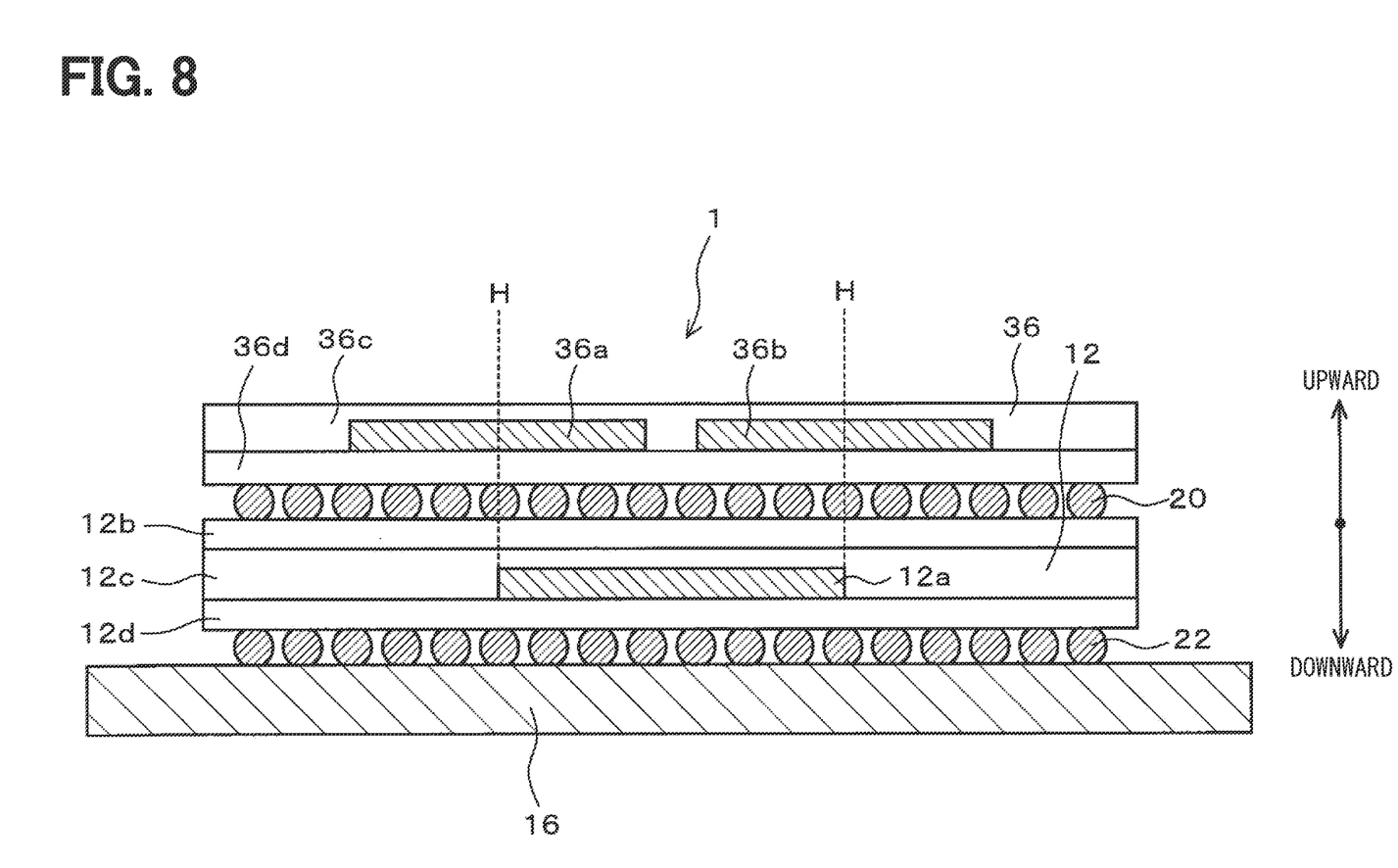
FIG. 8 is a vertical cross-sectional view showing a schematic configuration of an electronic device according to an eighth embodiment.

Next, an electronic device 1 according to an eighth embodiment will be described. As shown in FIG. 8, in the electronic device 1 according to the eighth embodiment, an upper package 36 includes an upper chip 36a and an upper chip 36b arranged in parallel in the lateral direction inside the upper package 36. Then, substantially central portions of the upper chip 36a and the upper chip 36b are arranged so as to match end positions H of the lower chip 12a of the lower package 12.

With this configuration, since the upper chip 36a and the upper chip 36b, which are IC chips, are rigid, a warp at the end positions H of the lower chip 12a of the lower package 12 can be suppressed. Therefore, the solder strain of the electronic device 1 can be reduced.

Ninth Embodiment

Figure 9:
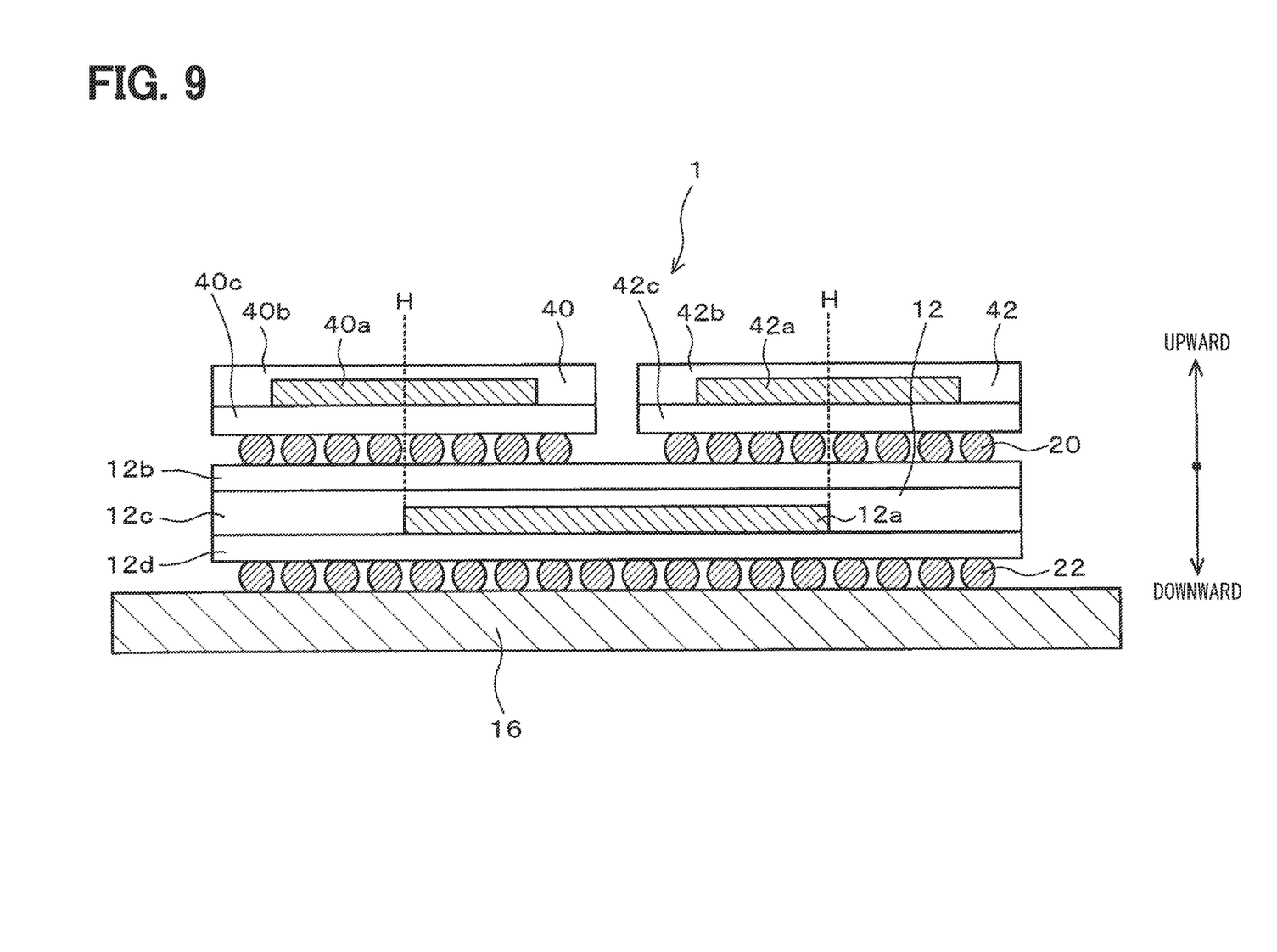
FIG. 9 is a vertical cross-sectional view showing a schematic configuration of an electronic device according to a ninth embodiment.

Next, an electronic device 1 according to a ninth embodiment will be described. As shown in FIG. 9, in the electronic device 1 according to the ninth embodiment, an upper package 40 and an upper package 42 are disposed above the lower package 12. The upper package 40 includes an upper chip 40a, an upper layer 40b, and a lower layer 40c. The upper package 42 includes an upper chip 42a, an upper layer 42b, and a lower layer 42c. The upper package 40 and the upper package 42 are arranged in parallel in the lateral direction above the lower package 12. At this time, central portions of the upper package 40, the upper chip 40a, the upper package 42, and the upper chip 42a are arranged so as to match the end positions H of the lower chip 12a.

With this configuration, since the upper package 40 and the upper tip 40a, and the upper package 42 and the upper tip 42a are rigid, a warp at the end positions H of the lower chip 12a of the lower package 12 can be suppressed. Therefore, the solder strain of the electronic device 1 can be reduced.

Although the present disclosure has been made in accordance with the embodiments, it is understood that the present disclosure is not limited to such embodiments and structures. The present disclosure encompasses various modifications and variations within the scope of equivalents. In addition, various combinations and forms, and further, other combinations and forms including only one element, or more or less than these elements are also within the scope and the scope of the present disclosure.

What is claimed is:

1. An electronic device comprising:
   an upper package including an upper chip;
   a lower package including a lower chip;
   a printed circuit board above which the upper package and the lower package are laminated;
   a plurality of solder balls connecting the upper package and the lower package; and
   a plurality of solder balls connecting the lower package and the printed circuit board, wherein
   the lower package has a thermal expansion coefficient set between a thermal expansion coefficient of the upper package and a thermal expansion coefficient of the printed circuit board, and
   each of the solder balls connecting the upper package and the lower package has a diameter larger than a diameter of each of the solder balls connecting the lower package and the printed circuit board.

2. An electronic device comprising:
   an upper package including an upper chip;
   a lower package including a lower chip;
   a printed circuit board above which the upper package and the lower package are laminated;
   a plurality of solder balls connecting the upper package and the lower package; and
   a plurality of solder balls connecting the lower package and the printed circuit board, wherein the lower package has a thermal expansion coefficient set between a thermal expansion coefficient of the upper package and a thermal expansion coefficient of the printed circuit board, each of the solder balls connecting the upper package and the lower package has a diameter smaller than a diameter of each of the solder balls connecting the lower package and the printed circuit board, and a difference between the thermal expansion coefficient of the upper package and the thermal expansion coefficient of the lower package is smaller than a difference between the thermal expansion coefficient of the lower package and the thermal expansion coefficient of the printed circuit board.

3. An electronic device comprising:
an upper package including an upper chip;
a lower package including a lower chip;
a printed circuit board above which the upper package and the lower package are laminated;
a plurality of solder balls connecting the upper package and the lower package; and
a plurality of solder balls connecting the lower package and the printed circuit board, wherein the lower package has a thermal expansion coefficient set between a thermal expansion coefficient of the upper package and a thermal expansion coefficient of the printed circuit board, and a ratio of a diameter of each of the solder balls connecting the lower package and the printed circuit board to a diameter of each of the solder balls connecting the upper package and the lower package is equal to a ratio of a difference between the thermal expansion coefficient of the lower package and the thermal expansion coefficient of the printed circuit board to a difference between the thermal expansion coefficient of the upper package and the thermal expansion coefficient of the lower package.

* * * * *